United States Patent [19]

Kawaguchi et al.

[11] Patent Number: 5,330,882
[45] Date of Patent: Jul. 19, 1994

[54] PROCESS FOR EXPOSING A PHOTOSENSITIVE RESIN COMPOSITION TO LIGHT

[75] Inventors: Chitoshi Kawaguchi, Soraku; Seiji Arimatsu, Hirakata; Katsuji Konishi, Ibaraki; Kazunori Kanda, Yao, all of Japan

[73] Assignee: Nippon Paint Co., Ltd., Osaka, Japan

[21] Appl. No.: 709,964

[22] Filed: Jun. 4, 1991

[30] Foreign Application Priority Data

Jun. 5, 1990 [JP] Japan .................................. 2-146614

[51] Int. Cl.$^5$ ................................................ G03C 5/00
[52] U.S. Cl. .................................... 430/327; 522/4; 522/913
[58] Field of Search ...................... 430/327; 522/4, 913

[56] References Cited

U.S. PATENT DOCUMENTS 4,716,097 12/1981 Weed ................................. 430/327
4,978,604 12/1990 Banks et al. ......................... 430/327

FOREIGN PATENT DOCUMENTS 2135468 8/1984 United Kingdom .

OTHER PUBLICATIONS

Decker et al., Photographic Science and Engineering, vol. 23, No. 3, 137–140 (1979).

*Primary Examiner*—Roland Martin
*Attorney, Agent, or Firm*—Wenderoth, Lind & Ponack

[57] ABSTRACT

The present invention provides an improved process by which dissolved oxygen is effectively removed from a photosensitive resin layer of a photosensitive resin plate. The process comprises preliminarily exposing the photosensitive resin to light to quench oxygen dissolved in said photosensitive resin layer before conducting a main exposure. The photosensitive resin layer is prepared from a photosensitive resin composition which comprises:

(a) a polymer binder,
(b) a radically polymerizable monomer,
(c) a sensitizing dye, and
(d) a photopolymerization initiator which is excited by a light of a different wave length from a light exciting the sensitizing dye.

The preliminary exposure is conducted with a light only exciting the sensitizing dye and the main exposure is conducted with a light exciting the photopolymerization initiator.

11 Claims, No Drawings

PROCESS FOR EXPOSING A PHOTOSENSITIVE RESIN COMPOSITION TO LIGHT

FIELD OF THE INVENTION

The present invention relates to a process for exposing a photosensitive resin composition to light when printing.

BACKGROUND OF THE INVENTION

Photosensitive resin compositions generally cure through radical polymerization, upon exposing to light. The curing reaction is inhibited by oxygen which is dissolved in the resin compositions, because the oxygen functions as a radical scavenger. It is therefore necessary that the dissolved oxygen is removed from the resin composition before exposure.

The removal of the dissolved oxygen can be conducted by placing the photosensitive resin plates in an atmosphere of carbon dioxide gas or nitrogen gas overnight before exposure in order to replace the dissolved oxygen with carbon dioxide or nitrogen gas. This method takes a long time and needs a large space for a machine. Practically conducted methods are those wherein the resin plates are preliminarily exposed (or bumped) with weak light to quench the dissolved oxygen and then subjected to a main exposure. The preliminary exposure (or bump) requires specific conditions limited for only quenching the dissolved oxygen, for example exposing time, irradiated light density and the like. In addition, if the photosensitive resin layer has a thickness of more than 0.1 mm, the weak light does not sufficiently reach to the side of the substrate, at which the removal of the dissolved oxygen is insufficient. In the following main exposure, this side will not cure sufficiently due to the remaining oxygen. Accordingly, after developing, isolated dots have barrel-like shapes and thin toward the substrate, thus resulting in the decline of durability. If an attempt is made to quench the dissolved oxygen sufficiently at this side in the preliminary exposing process, the surface which faces to light would start to unnecessarily cure. Also, if the main exposure is conducted for a longer period of time in order to sufficiently cure the side of the substrate, the etching depth of white portions and dot portions is shallow and the printing portions are thicker than negative images. It also takes a long period of time to produce printing plates and ununiformity of polymerization reaction reduces the durability of the printing plates.

SUMMARY OF THE INVENTION

The present invention provides an improved process by which dissolved oxygen is effectively removed from a photosensitive resin layer of a photosensitive resin plate. The process comprises preliminarily exposing the photosensitive resin plate to light to quench oxygen which is dissolved in said photosensitive resin layer before conducting a main exposure, wherein the photosensitive resin layer is prepared from a photosensitive resin composition which comprises to
(a) a polymer binder,
(b) a radically polymerizable monomer,
(c) a sensitizing dye, and
(d) a photopolymerization initiator,
wherein the preliminary exposure is conducted with a light only exciting the sensitizing dye, and the main exposure is conducted with a light exciting the photopolymerization initiator.

The present invention also provides a photosensitive resin composition for the above mentioned process, comprising:
(a) a polymer binder,
(b) a radically polymerizable monomer,
(c) a sensitizing dye, and
(d) a photopolymerization initiator which is excited by a light of a different wave length from a light exciting the sensitizing dye.

DETAILED DESCRIPTION OF THE INVENTION

The polymer binder (a) employed in the present invention is added to control physical properties and chemical properties of the obtained resin composition, and hardness of a cured material. The binder (a) preferably has a polymerization degree of 10 to 300,000, preferably 50 to 3,000 and, if necessary, contains a radically polymerizable group therein. It also has a molecular weight of 100 to 1,000,000, preferably 5,000 to 500,000, determined by GPC method. If the binder contains particles, they have a particles size of 0.01 to 5 micron, preferably 0.02 to 1 micron. The presence of the radically polymerizable group enhances durability, ink resistance and solvent resistance of obtained printing plates. Examples of the binder (a) are a water soluble polymer binder not having an ionic group, such as polyvinyl alcohol, polyamide resin, cellulose resin, a modified resin thereof, etc.; a water-soluble or water-dispersible polymer binder having an ionic group or a nonionic hydrophilic group, such as acrylic resin, polyester resin, epoxy resin, alkyd resin, polybutadiene resin, polyalkadiene resin, polyurethane resin, polyurea resin, fluorine resin, silicone resin, amino resin, phenol resin, vinyl resin, etc. which are modified by introducing the ionic or nonionic group (these binders are known in the field of aqueous paint, aqueous ink and water-developable printing plates); three dimensionally crosslinked resin particles with an ionic group having a particle size of 0.01 to 5 micron, such as polymer particles prepared from aliphatic diene monomers and acryl monomers; an organic solvent-soluble polymer binder, such as rubber polymers (e.g. polybutadiene, polyisoprene, styrene-isoprene-styrene copolymer), acyl resin, polyester resin, epoxy resin, alkyd resin, polyurethane resin, polyurea resin, fluorine resin, silicone resin, amino resin, phenol resin, etc.; and the like.

The radically polymerizable monomer (b) employed in the present invention is not limited as long as it has an ethylenically unsaturated group, for example (meth)acrylate, such as methyl (meth)acrylate, ethyl (meth)acrylate, n-propyl (meth)acrylate, beta-hydroxyethyl (meth)acrylate, beta-hydroxypropyl (meth)acrylate, polyethyleneglycol mono(meth )acrylate, polypropyleneglycol mono(meth)acrylate, polyethyleneglycol di(meth)acrylate, polypropyleneglycol di(meth)acrylate, methoxypolyethyleneglycol mono(meth)acrylate, ethoxypolyethyleneglycol (meth)acrylate, glycerol di(meth)acrylate, pentaerythritol di(meth)acrylate, trimethylolpropane tri(meth)acrylate, tetramethylolmethane tetra(meth)acrylate, ethyleneglycol diglycidyl ether di(meth)acrylate, polyethyleneglycol diglycidyl ether di(meth)acrylate, 1,4-butanediol di(meth)acrylate and 1,6-hexanediol di(meth)acrylate; (meth)acrylamide, such as (meth)acrylamide, N-methylol (meth)acrylamide, n-butoxymethyl (meth)acrylamide, i-butoxymethyl (meth)acrylamide, N-t-butyl (meth)acrylamide, methylenebis((meth)acrylamide), ethylenebis((meth)acrylamide) and propylenebis ((meth)acrylamide); and the like.

The sensitizing dye (c) of the present invention is not limited and can be anyone which is used in this field. Typical examples of the dyes are xanthenes, such as rose bengal, eosine, erythrosine B, Huoresein, rhodamine B and the like; thiazines, such as methylene blue, thionine and the like; chlorophills; quinones, such as Atromentine, Muscarufine, Helindon, Yellow CG, Helinedon Brown CM and CV, alukanine, naphthazaline, alizarine and the like; indigos, such as thioindigo; porphyrins, such as phthalocyanines; ruthenium complexes, such as trisbipyrizine ruthenium complex salts; and the like. Preferred are rose bengal, eosine and methylene blue.

The photopolymerization initiator (d) of the present invention is preferably required to be excited by a light of a different wave length from a light which excites the sensitizing dye. Examples of the initiators are benzoin alkyl ether, such as benzoin methyl ether and benzoin isopropyl ether; benzophenones, such as benzophenone, o-benzoyl benzoic methyl, N,N'-tetraethyl-4,4'-diaminobenzophenone and Michler's ketone; acetophenones, such as 2,2-diethoxy acetophenone, 2,2-dimethoxy-2-phenyl acetophenone, alpha-hydroxycyclohexyl phenyl ketone and 2-hydroxy-2-methyl-1-phenyl-1-one; camphorquinone; a combination of a bromide or amine compound with ethylanthraquinone, 1,4'-diethylthioxanthone, benzyl, 1-phenyl-1,2-propanedione, methylbenzoyl formate, 2,3-butandiones and the like; a combination of a radical generator (e.g. N-phenylglycines, diaryliodonium salts, peroxides, peroxyesters, organic halides etc.) and a dye (e.g. thioxanthene dye, cumarine dye, merocyanine dye, thioxanthone dye, titanocene dye etc.); and the like. The initiator (d) is selected such that the initiator is excited by a light having a different wave length from a light which excites the sensitizing dye. Typically, since the sensitizing dye generally has a maximum absorption wave length within the range of 400 to 800 nm, the initiator (d) preferably has a maximum absorption wave length of 300 to 500 nm.

The photosensitive resin composition of the present invention may further contain a solvent (e.g. water, alcohols, etc.) and additives (e.g. a plasticizer, a polymerization inhibitor, an anti-aging agent, etc.), if necessary.

In the photosensitive resin composition of the present invention, the dye (c) and initiator (d) are both present in a catalytic amount in the composition. Typically the dye ( c ) is present in an amount of 0.0001 to 5 parts by weight, preferably 0.0005 to 2 parts by weight, more preferably 0.005 to 1 part by weight and the initiator (d) is in an amount of 0.01 to 15 parts by weight, preferably 0.05 to 10 parts by weight, more preferably 0.2 to 5 parts by weight, based on 100 parts by weight of the total of the binder (a) and the monomer (b). If the amount of dye (c) is less than 0.0001 part by weight, the dissolved oxygen is not effectively removed during the bump exposure and, if it is more than 5 parts by weight, the dye absorbs the irradiated light so as not to sufficiently remove the dissolved oxygen and the resin composition also has dark color. If the amount of initiator is less than 0.01 part by weight, the curing is poor and, if it is more than 15 parts by weight, the curing proceeds around the surface and the curing near the bottom is poor. A weight ratio of the monomer (b)/the binder (a) is within the range of 0.1/99.9 to 99.9/0.1. If the monomer (b) is less than the above range, film-forming ability is poor and, if it is more than the range, the toughness of the cured film is poor.

The resin composition may be prepared by mixing the above mentioned components by a conventional method, such as a kneader or if necessary with the solvent.

The photosensitive resin composition is generally applied on a substrate to form a photosensitive resin plate. Examples of the substrates are aluminum plate, polyester sheet, copper plate, zinc plate, chromium plated plate, glass plate, iron plate and the like. The application can be conducted by coating or extruding. The photosensitive resin layer preferably has a thickness of 0.1 to 10 mm. The resin plate may be covered with a film (e.g. Hicelon available from Nippon Synthetic Chemical Industry Co., Ltd. ) to prevent oxygen from invading into the resin layer. When the resin composition of the present invention is employed as UV paint, it is applied by spray coating, roll coating, dipping and the like after, if necessary, diluting with a thinner. The film thickness of the UV paint preferably is within the range of 1 to 200 micron.

In the present invention, the resin plate is preliminarily exposed to a light to quench oxygen which is dissolved in the resin layer. The light for the preliminary exposure has a wave length range which only excites the sensitizing dye (c) and which does not excite the photopolymerization initiator (d). In the relation between the sensitizing dye (c) and the initiator (d), if the maximum light absorption wave length of the dye (c) is expressed $\lambda_{max(c)}$ and that of the initiator (d) is expressed $\lambda_{max(d)}$, it is preferred that $\lambda_{max(c)}$ is within the range of 450 to 800 nm and $\lambda_{max(d)}$ is within the range of 300 to 400 nm. The difference between them satisfies the following formula.

$$|\lambda_{max(c)} - \lambda_{max(d)}| > 100 \text{ nm}$$

If the above formula is satisfied, the preliminary (bump) and main exposures are conducted most effectively. Most preferred is a combination of rose bengal, eocine Y, methylene blue as the dye (c) and benzoine ethers as the initiator (d). The exposure is conducted over all the surface of the resin plate. The exposing time is not limited but generally is 10 seconds to 120 minutes. The light source includes an incandescent lamp, a fluorescent lamp, a chemical lamp, an intermediate or high pressure mercury lamp, a halide lamp and the like. If the light source produces a light which excites the initiator, such wave length light should be cut off by a conventional filter.

After the preliminary exposure (bump), the main exposure is conducted through a negative by a conventional method. The light for the main exposure is not so limited, because any light can be used as long as it includes a wave length range which excites the initiator (d). The light sources are three type:

I. a light source which only excites the initiator.
II. a light source which excites not only the initiator but also the sensitizing dye.
III. a combination of a light which excites the initiator and a light which excites the sensitizing dye.

The type II and III are preferred because of an inhibiting function of dissolving oxygen into the resin layer during the main exposure. In case of a three dimensional imaging system using a laser light, although it takes a long time for a main exposure, the light source of type III effectively inhibits it during the main exposure. Examples of the lights are ultraviolet beams. The exposing time is not limited but typically is 3 seconds to 30 minutes.

After the main exposure, the resin plate is developed to produce printing images. The development can be carried out by a conventional method with a solvent (e.g. water or alkaline water; alcohols; halogenated hydrocarbons, such as trichloroethane and tetrachloroethane; aromatic hydrocarbons, such as toluene and xylene) or using physical means (e.g. brushing).

The oxygen quenching mechanism of the present invention is not understood, but is believed to be as follows. The preliminary exposure excites the sensitizing dye (c) and the excited energy is transferred onto the oxygen dissolved in the resin layer. The excited oxygen is addition-reacted with the double bonds in the monomer (b), so that the oxygen which prevents polymerization reaction is quenched in the monomer. Accordingly, in the main exposure, polymerization reactions are proceed smoothly and can avoid ununiformity of polymerization, especially in the thickness direction. Isolated dots are faithfully produced without side etching and the etching depth of white portions and dot portions is deep.

The photocurable resin composition of the present invention can quench the dissolved oxygen before main curing and polymerization reactions in the main exposure proceed ideally and therefore can be widely applicable to photoresists for electronic elements, three dimensional imaging system, adhesives including dental fields and coatings. Especially in flexographic printing, since the inhibition of polymerization does not occur, an exposing time at the main exposure can be reduced to obtain thinner images than negative images and avoid dot gain.

EXAMPLES

The present invention is illustrated by the following Examples which, however, are not construed as limiting the present invention to their details.

EXAMPLES 1 TO 3 AND COMPARATIVE EXAMPLES 1 TO 4

A sensitizing dye listed in Table 1 and 40 parts by weight of a partially saponified polyvinyl acetate (a polymerization degree of 500 and a saponification degree of 80 mol %) were mixed in 60 parts by weight of water to form a solution. To the solution, 15 parts by weight of glycerol monomethacrylate, 15 parts by weight of glycerol dimethacrylate, 1.2 parts by weight of 2,2-dimethoxy-2-phenylacetophenone and 0.08 parts by weight of 2,6-di-t-butyl-4-methylphenol were mixed to obtain a uniform photosensitive resin composition.

The resulting composition was poured on an iron plate having an anti-halation layer and heat-dried in a dark place for one day to obtain a resin plate having a resin layer of 1.0 mm. On the resin layer, a polyvinyl alcohol film (Hicelon available from Nippon Synthetic Chemical Industry Co., Ltd.) having a thickness of 16 micrometer was laminated. The resin plate was subjected to a preliminary exposure at irradiation conditions as shown in Table 1 with a light source through a filter as shown in Table 1. Then, a negative film was closely contacted under vacuum and then main-exposed to a light as shown in Table 1 to cure. If the same light source was employed in Table 1, a filter was employed in the preliminary exposure and then was taken off. Thereafter, the negative film was removed and developed by spraying water of 40° C. at a water pressure of 4 Kg/cm$^2$ for 2 minutes, and then dried at 90° C. for 10 minutes in a drying apparatus.

Measurements were made on diameters of minumal isolated dots of the reproduced images, side-etched or not, a depth of hole having 3.5 mm diameter and a depth of 65 line 90% reverse hole dots portions. The results are shown in Table 1.

TABLE 1

|  | Examples | | | Comparative Examples | | | |
|---|---|---|---|---|---|---|---|
|  | 1 | 2 | 3 | 1 | 2 | 3 | 4 |
| Sensitizing dye (parts by weight) | Rose Bengal*[1] (0.01) | Eosine*[2] (0.01) | Rose Bengal (0.01) | — | — | Rose Bengal (0.01) | Rose Bengal (0.01) |
| Light sources | 65 W chemical lamp | 65 W Chemical lamp | 3 KW Ultrahigh pressure mercury lamp | 65 W Chemical lamp | 65 W Chemical lamp | 65 W Chemical lamp | 3 KW Ultrahigh pressure mercury lamp |
| Clear Color No. 40*[3] | use | use | use | Not used | Use | Not used | Not used |
| Exposing distance (cm) | 5 | 5 | 60 | 5 | 5 | 5 | 60 |
| Exposing time (sec) | | | | | | | |
| for bump | 300 | 300 | 15 | 3 | 300 | 2 | 2 |
| for main | 120 | 120 | 20 | 240 | 480 | 240 | 40 |
| Irradiated light | | | | | | | |
| for bump | Visible light | Visible light | Visible light | Ultraviolet | Visible light | Ultraviolet | Ultraviolet |
| for main | Ultraviolet | Ultraviolet | Ultraviolet | Ultraviolet | Ultraviolet | Ultraviolet | Ultraviolet |
| Diameter of isolated dots | 200 | 200 | 200 | 200 | 200 | 200 | 200 |
| Side etched | Not | Not | Not | Side etched | Side etched | Side etched | Side etched |
| Depth of | | | | | | | |
| white portions*[4] | 1,000 | 1,000 | 1,000 | 598 | 582 | 661 | 732 |
| 65 line 90% hole*[5] | 38 | 47 | 40 | 21 | 13 | 24 | 17 |

*[1]A dye having $\lambda_{max}$ 558 nm
*[2]A dye having $\lambda_{max}$ 518 nm
*[3]A filter cutting off less than 450 nm available from Kimoto Co., Ltd.
*[4]35 mm diameter
*[5]reverse

EXAMPLE 4

A photosensitive resin composition was prepared by mixing 66.5 parts by weight of three-dimensionally crosslinked polymer particles (80 mol % of butadiene, 6.5 mol % of methacrylic acid, 1 mol % of divinylbenzene and 12.5 mol % of methyl methacrylate and having a particle size of 0.06 micron), 8 parts by weight of N,N-dimethylaminepropyl methacrylamide, 6 parts by weight of phenoxyethoxy ethanol, 12 parts by weight of lauryl methacrylate, 5 parts by weight of trimethylolpropane triacrylate, 2 parts by weight of 2,2-dimethoxy-2-phenyl acetophenone, 0.5 parts by weight of 2,6-di-t-butyl-4-methylphenol and 0.0075 parts by weight of Rose Bengal at 60° C., using a double roll and a kneader. The resin composition was extruded onto an iron plate to obtain a photosensitive resin plate having about 0.4 mm resin layer.

On the resin layer, a matte finish, which was prepared by mixing 15 g of hydroxycellulose and 95 g of distilled water and then dispersing therein 4 g of silica having an average particle size of 15 micrometer, was coated to form a matte coat of 3 micrometer, and then dried at 70° C. for 2 minutes.

The resulting resin plate was preliminarily exposed, or bumped with the light though the filter and exposing conditions were as shown in Table 2. After removing the filter if used, a negative film was closely contacted with the resin layer and main-exposed to light to cure. The negative film was removed and developed with water at 40° C. for 2 minutes, using a brush elution developer and post-cured in a drying room at 110° C. for 2 minutes under a 2 KW high pressure mercury lamp. The resulting imaged plate was subjected to an evaluation of images and the results are shown in Table 2.

EXAMPLE 5

A resin plate was prepared as generally described in Example 4, with the exception that a copolymer was prepared from 79 mol % of butadiene, 6.7 mol % of methacrylic acid, 1.3 mol % of ethyleneglycol dimethacrylate and 13 mol % of methyl methacrylate was employed. The same evaluation was made and the results are shown in Table 2.

COMPARATIVE EXAMPLE 5

The same procedure and evaluation of Example 5 were repeated except that Rose Bengal was not employed and the results are shown in Table 2.

COMPARATIVE EXAMPLE 6

The same procedure and evaluation of Example 4 were repeated except that Rose Bengal was not employed and the results are shown in Table 2.

TABLE 2

| | Examples | | Comparative Examples | |
|---|---|---|---|---|
| | 4 | 5 | 5 | 6 |
| Sensitizing dye (parts by weight) | Rose Bengal[1] (0.0075) | Rose Bengal (0.0075) | — | — |
| Light sources | 3 KW Ultrahigh pressure mercury lamp | 3 KW Ultrahigh pressure mercury lamp | 3 KW Ultrahigh pressure mercury lamp | 3 KW Ultrahigh presure mercury lamp |
| Fremirrow Bochu[2] | use | use | Not used | Not used |
| Exposing distance (cm) | 60 | 60 | 60 | 60 |
| Exposing time (sec) | | | | |
| for bump | 14 | 22 | 1.5 | 1.5 |
| for main | 16 | 16 | 42 | 42 |
| Irradiated light | | | | |
| for bump | Visible light | Visible light | Ultraviolet | Ultraviolet |
| for main | Ultraviolet | Ultraviolet | Ultraviolet | Ultraviolet |
| Minimum remaining dots % | 3 | 2–3 | 3 | 2–3 |
| 65 line 90% dots | 41 | 48 | 22 | 21 |
| Depth of white portions | | | | |
| Dot diameter (micrometer) | | | | |
| 5% (98 m negative)[3] | 88 | 84 | 98 | 97 |
| 10% (140 m negative)[3] | 125 | 125 | 139 | 138 |
| 80% (196 m negative)[4] | 202 | 205 | 189 | 194 |
| 90% (120 m negative)[4] | 126 | 129 | 113 | 121 |

[1]Maximum absorption wave length 558 nm
[2]A filter cutting a wave length of less than 450 nm or less.
[3]Dot diameter
[4]Hole diameter

EXAMPLE 6

A photosensitive resin composition was prepared by dissolving 0.05 mol of 2-ethylanthraquinone, 0.05 mol of carbon tetrabromide, 0.25 mol of N-methyldiethanolamine and 0.5 g of rose bengal in a mixture of 500 g of an oligomer (available from Shin Nakamura Chemical Industry K.K. as NK Ester BPE-1300).

Three grams of the resin composition was charged in an aluminum cylindrical can having a depth of 7 mm and a diameter of 55 mm and exposed (bumped) to a yellow lamp for 15 minutes at a distance of 5 cm. While the bump continued, it was irradiated by a 15 mV He-Cd laser available from Omunichrome Company at a scanning mode of 15 mm/sec to obtain a cured article.

What is claimed is:

1. A process for exposing a photosensitive resin plate comprising a substrate and a photosensitive resin layer on said substrate, which process comprises preliminarily exposing said resin plate to light to quench oxygen dissolved in said photosensitive resin layer and then conducting a main exposure, wherein said photosensitive resin layer has a thickness of 0.1 to 10 mm and is prepared from a photosensitive resin composition which comprises:
   (a) a polymer binder which is three dimensionally crosslinked resin particles with an ionic group, having a particle size of 0.01 to 5 microns,
   (b) a radically polymerizable monomer,
   (c) a sensitizing dye, and (d) a photopolymerization initiator which is excited by a light of a different wave length from a light exciting said sensitizing dye, wherein said preliminary exposure is conducted with a light only exciting said sensitizing dye, and said main exposure is conducted with a light exciting said photopolymerization initiator.

2. The process according to claim 1 wherein said three dimensionally crosslinked resin particles are prepared from aliphatic diene monomers and acryl monomers.

3. The process according to claim 1 wherein said polymer binder (a) has a molecular weight of 100 to 1,000,000.

4. The process according to claim 1 wherein said polymer binder (a) contains a radically polymerizable group.

5. The process according to claim 1 wherein said radically polymerizable monomer (b) is selected from the group consisting of (meth)acrylates, (meth)acrylamide and a mixture thereof.

6. The process according to claim 1 wherein said sensitizing dye (c) is selected from the group consisting of xanthenes, thiazines, chlorophills, quinones, indigos, porphyrins, ruthenium complexes and a mixture thereof.

7. The process according to claim 1 wherein said photopolymerization initiator (d) is selected from the group consisting of benzoin alkyl ether, benzophenones, acetophenones, camphorquinone and a mixture thereof.

8. The process according to claim 1 wherein said photosensitive resin composition further comprises a solvent and additives.

9. The process according to claim 1 wherein said photosensitive resin composition comprises 0.0001 to 5 parts by weight of said sensitizing dye (c) and 0.01 to 15 parts by weight of said initiator (d), based on 100 parts by weight of the total of said binder (a) and the monomer (b).

10. The process according to claim 1 wherein the weight ratio of the monomer (b)/the binder (a) is within the range of 0.1/99.9 to 99.9/0.1.

11. The process according to claim 1 wherein said sensitizing dye (c) and said initiator (d) satisfy the following relation, where the maximum absorption wave length of said sensitizing dye (c) is expressed as $\lambda_{max(c)}$ and that of said initiator (d) is expressed as $\lambda_{max(d)}$:

$$\lambda_{max(c)} = 450 \text{ to } 800 \text{ nm}$$

$$\lambda_{max(d)} = 300 \text{ to } 400 \text{ nm}$$

$$|\lambda_{max(c)} - \lambda_{max(d)}| > 100 \text{ nm},$$

* * * * *